(12) United States Patent
Agarwal et al.

(10) Patent No.: US 7,622,942 B2
(45) Date of Patent: Nov. 24, 2009

(54) METHOD AND APPARATUS FOR MEASURING DEVICE MISMATCHES

(75) Inventors: Kanak B. Agarwal, Austin, TX (US); Ying Liu, Austin, TX (US); Chandler T. McDowell, San Jose, CA (US); Sani R. Nassif, Austin, TX (US); James F. Plusquellic, Owing Mills, MD (US); Jayakumaran Sivagnaname, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/147,024

(22) Filed: Jun. 26, 2008

(65) Prior Publication Data

US 2008/0258752 A1 Oct. 23, 2008

Related U.S. Application Data

(62) Division of application No. 11/422,913, filed on Jun. 8, 2006, now Pat. No. 7,408,372.

(51) Int. Cl.
*G01R 31/26* (2006.01)

(52) U.S. Cl. .................................... 324/765; 324/769
(58) Field of Classification Search .................. None
See application file for complete search history.

(56) References Cited

U.S. PATENT DOCUMENTS

| 4,638,243 | A  | * | 1/1987  | Chan ........................... 324/509 |
| 5,181,205 | A  |   | 1/1993  | Kertis |
| 6,242,936 | B1 | * | 6/2001  | Ho et al. ...................... 324/765 |
| 6,496,027 | B1 | * | 12/2002 | Sher et al. .................... 324/763 |

* cited by examiner

*Primary Examiner*—Vinh P Nguyen
(74) *Attorney, Agent, or Firm*—Libby Z. Handelsman; Jack V. Musgrove

(57) ABSTRACT

A test structure for statistical characterization of local device mismatches contains densely populated SRAM devices arranged in a row/column addressable array that enables resource sharing of many devices. The test structure includes a built-in sensing mechanism to calibrate or null out sources of error, and current steering to avoid negative effects of current leakage along spurious paths. The gate and drain lines of each column are driven from both the top and bottom to minimizes parasitic effects. The system can handle a large number of devices while still providing high spatial resolution of current measurements.

14 Claims, 5 Drawing Sheets

METHOD AND APPARATUS FOR MEASURING DEVICE MISMATCHES

CROSS-REFERENCE TO RELATED APPLICATION

This application is a divisional of U.S. patent application Ser. No. 11/422,913 filed Jun. 8, 2006, now U.S. Pat. No. 7,408,372.

BACKGROUND OF THE INVENTION

1. Field of the Invention

The present invention generally relates to the design and testing of integrated circuits, and more particularly to a method and system for testing an array of electronic devices formed on an integrated circuit.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern one or more dies on a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Faster performance and predictability of responses are elements of interest in circuit designs. As process technology scales to the deep-submicron (DSM) regime, it is becoming increasingly important for the performance and reliability of IC chips and systems to understand how variations in process parameters affect the operation of an electronic device or circuit. A designer needs to model responses such as current flow with changes in voltage for transistors (I-V curves), or resistance/capacitance measurements for wiring. Device testing may further include leakage measurements across a gate, to indirectly assess the quality of an oxide material and identify potential flaws like pin holes or edge defects. Some devices such as static random-access memory (SRAM) require testing the memory elements with random fluctuations in threshold voltages to better characterize the circuit. Devices should also be stress tested, i.e., under different conditions such as varying temperatures.

One example of a circuit 10 used for such testing of an array of devices is shown in FIG. 1. The devices under test (DUTs) in circuit 10 may be, for example, transistors arranged in rows and columns. Each DUT 12 is connected to one of a plurality of column inputs 14 and one of a plurality of row inputs 16. Selectors 18 are used to transmit an output signal to a measurement unit 20, controlled by selector control logic 22. The input signals may be any parameter of interest, such as voltage or current. For example, when the DUTs are transistors, circuit 10 can provide varying input voltages and measure the current response. Selected voltage levels are injected at the desired DUT node through column and row inputs 14, 16, and the outputs of the transistors are routed through the appropriate selectors 18 to measurement unit 20. The output of measurement unit 20 is connected to a recording unit or a user interface device. I-V curves for the DUTs can be established by monitoring current responses for varying voltage inputs.

It is also useful to understand how spatial variations (i.e., devices located in different dies on a single wafer) can be affected by process parameters. While the outputs of circuit 10 provide a fair basis to characterize the response of the devices, the measurements are not completely accurate since they fail to take into consideration various effects on signal creation and transmission. Even metal wires have a very small resistance (as well as capacitance) that affects the propagation of signals in the wires. These loading effects can vary with wire length and environmental parameters such as temperature. Calibration of the measurement circuitry does not compensate for variations in the loading effects. Moreover, spatial variability in integrated circuits is becoming worse due to variations such as Leff variation, doping concentrations, spurious leakage, systematic variation due to chemical mechanical planarization, etc. Existing test structures cannot adequately account for the variability in these measurements. In order to reliably characterize the variabilities, hundreds of samples are needed, which is even more impractical given the limited number of input/output (C4) pads provided on the circuits. Prior art test systems only provide a few transistors on the kerf structure to monitor long-distance variabilities (wafer-to-wafer or die-to-die).

Circuit designers make assumptions about spatial variations of parameters which have a significant impact on product performance, but there is no reliable system for verifying these assumptions. It would, therefore, be desirable to devise an improved testing structure that can achieve high spatial resolution across many devices. It would be further advantageous if the test system could provide such resolution with nominal resource cost.

SUMMARY OF THE INVENTION

It is therefore one object of the present invention to provide an improved method of testing an array of electronic devices which provides high spatial resolution of measurements, e.g., capable of measuring current mismatches between two minimal strength devices in close proximity.

It is another object of the present invention to provide such a method which may be implemented in an array having a large number of devices under test while reducing or minimizing resource cost.

It is yet another object of the present invention to provide a circuit structure for testing an array of electronic devices which takes into account local variations in measurements caused by spurious leakage.

The foregoing objects are achieved in a method and system for testing an array of electronic devices arranged in rows and columns, comprising a plurality of column driver lines with at least one for each column of the devices under test (DUTs), a plurality of row output lines with at least one for each row of the DUTs, a plurality of driver/clamps which selectively drive at least one of the column driver lines with a drive voltage while connecting remaining column driver lines to a clamp voltage, a steering circuit which selectively directs a current output for one of the row output lines to a measurement pin at a first side of the array which is opposite a second side of the array while directing current output from remaining row output lines to a sink pin, a first plurality of taps at the first side of the array which sense first voltages of said row output lines, and a second plurality of taps at the second side of the array which sense second voltages of said row output lines. In the preferred embodiment the clamp voltage is a negative voltage. The steering circuit uses steering devices which lie in series between source terminals of the electronic devices and electrical ground. When the DUTs are transistors each having a gate, drain and source, the plurality of column driver lines includes a plurality of gate column driver lines and a plurality of drain column driver lines. In an alternative embodiment the drain and source for each transistor are shorted together to test gate oxide reliability. The driver/clamps can drive the column driver lines from both the top of the column driver lines and the bottom of the column driver lines, and may have sense voltage outputs at both the top and bottom.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to an improved method and apparatus for measuring mismatches in electronic devices. Local device mismatches have short correlation distances, so characterization of random mismatches requires test structures with closely placed devices wherein each device can effectively be measured individually. The structures disclosed herein are useful for such statistical characterization of intrinsic parameter fluctuations in metal-oxide semiconducting field-effect transistor (MOSFET) devices. The test structures feature a large array of densely populated SRAM-sized devices that allow fast and precise measurement of electrical characteristics of each individual device. These structures may be used to characterize the variations in device parameters for different threshold implantation levels in a 65 nm silicon-on-insulator (SOI) process.

Figure 1:
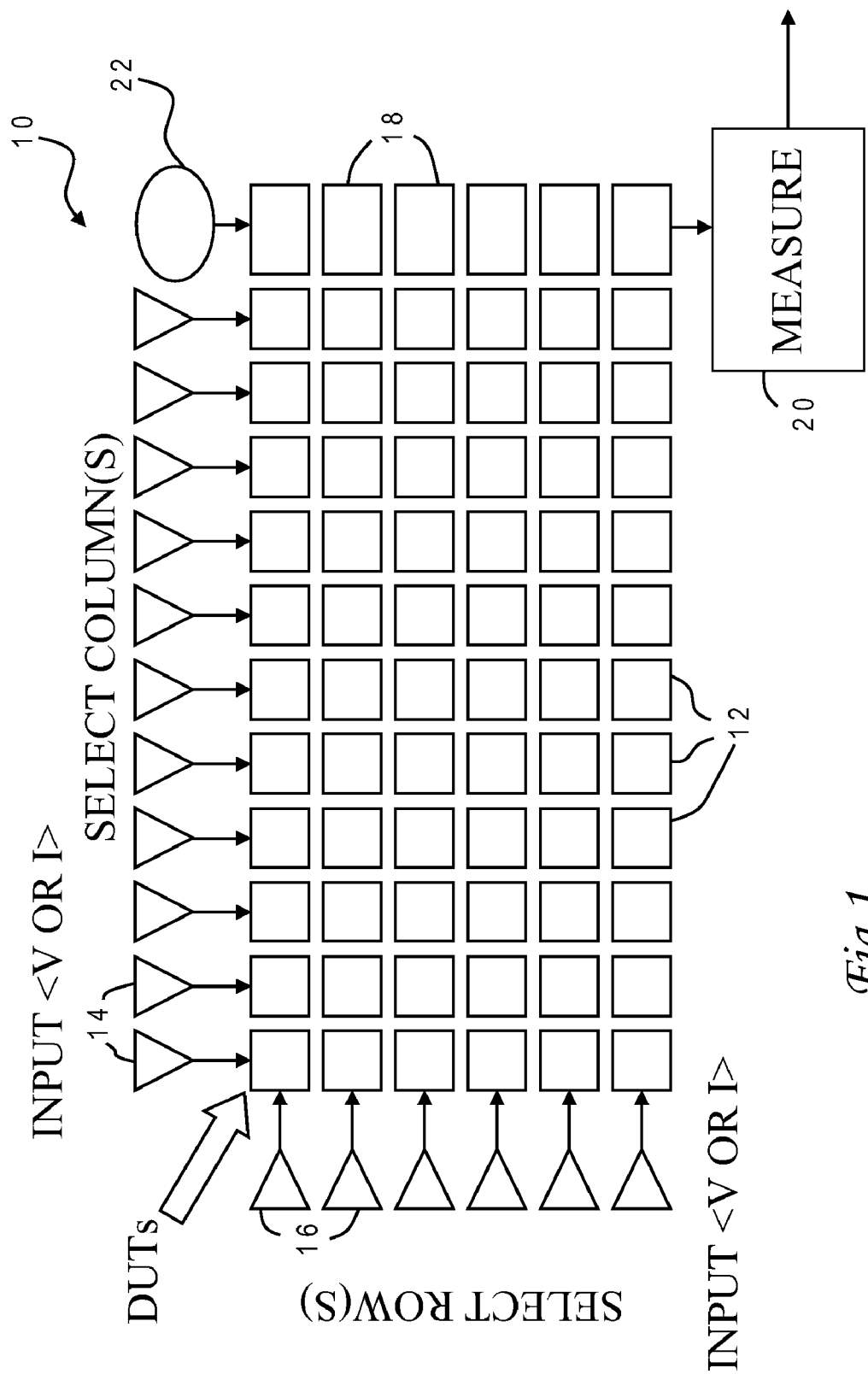
FIG. 1 is a block diagram of a conventional test system having devices under test (DUTs) arranged in a row/column addressable array.
Figure 2:
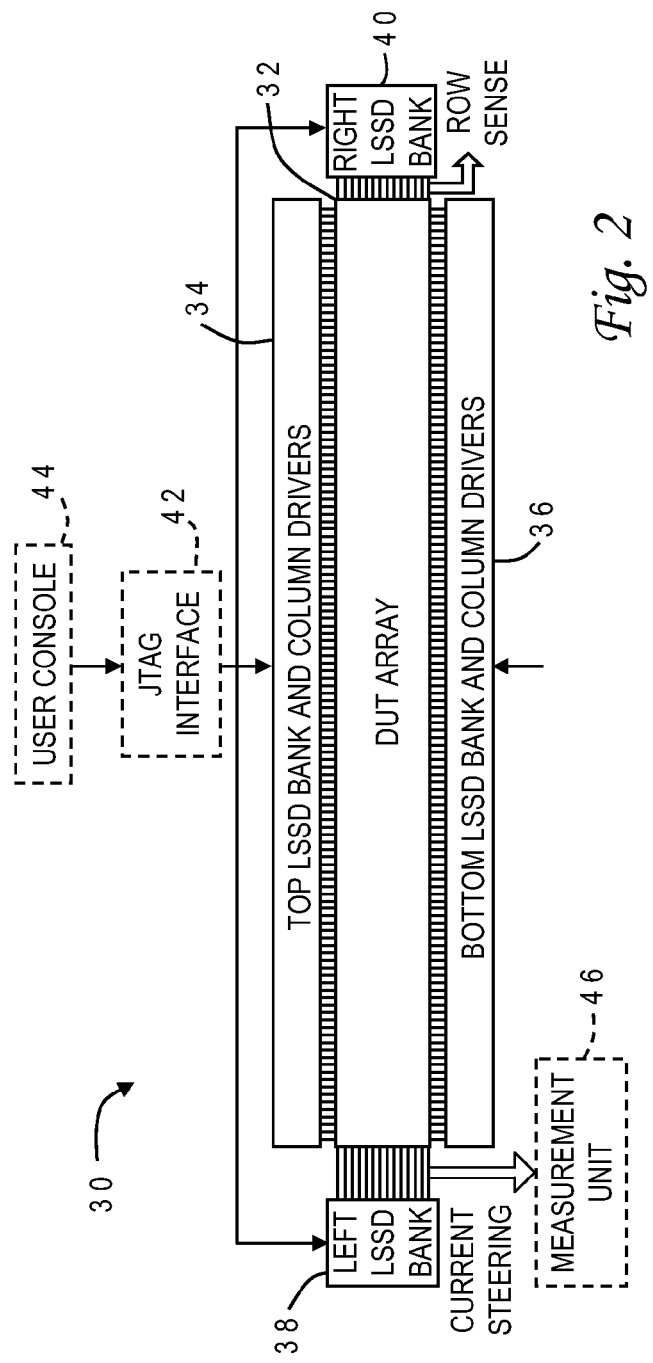
FIG. 2 is a plan view of a test system constructed on an integrated circuit in accordance with one embodiment of the present invention.

With reference now to the figures, and in particular with reference to FIG. 2, there is depicted a layout for one embodiment 30 of a test system constructed in accordance with the present invention. Test system 30 may be formed as part of a single integrated circuit (IC) test chip having various types of electronic devices to be tested, and is generally comprised of an addressable matrix or array 32 of the devices under test (DUTs), a top bank 34 of level-sensitive scan design (LSSD) latches and column drivers, a bottom bank 36 of LSSD latches and column drivers, a left side bank 38 of LSSD latches, and a right side bank 40 of LSSD latches. The DUTs in array 32 are arranged in rows and columns. In this particular embodiment, input signals are selectively provided to columns of DUT array 32 by the top and bottom banks 34, 36, and currents from the rows of DUT array 32 are steered toward left side LSSD bank 38 for measurement while taps at both the left and right side LSSD banks 38, 40 are used for source sensing, as explained further below.

The LSSD latches in each of banks 34, 36, 38, 40 are registers that are individually addressable via an external interface such as a JTAG interface 42 which complies with the Institute of Electrical and Electronics Engineers (IEEE) standard 1149.1 pertaining to a test access port and boundary-scan architecture. The external interface is further responsive to a user interface device such as a console 44, e.g., a personal computer or workstation programmed to allow the test engineer to selectively set the values in any of the LSSD latches.

The DUTs in array 32 can be single elements such as transistors, or more complicated circuit structures such as static, random-access memory (SRAM) devices. The DUTs can also be as simple as sections of interconnects with vias and contacts. The input signals which are provided by top and bottom banks 34, 36 may be any parameter of interest, such as voltage or current. For example, when the DUTs are transistors, test system 30 can provide varying input voltages (gate and/or drain) and measure the current responses. Selected voltage levels are injected at the desired DUT node(s) through column drivers in banks 34, 36, and the outputs of the transistors are routed through a switch array at left side LSSD bank 38 to a measurement unit 46. The output of measurement unit 46 is connected to a recording unit or a user interface device such as a video display. I-V curves for the DUTs can be established by monitoring current responses for varying voltage inputs. The output of measurement unit 46 may represent an output of a single DUT, or a composite output based on multiple DUTs whose outputs are selectively combined based on the LSSD latch settings.

Figure 3:
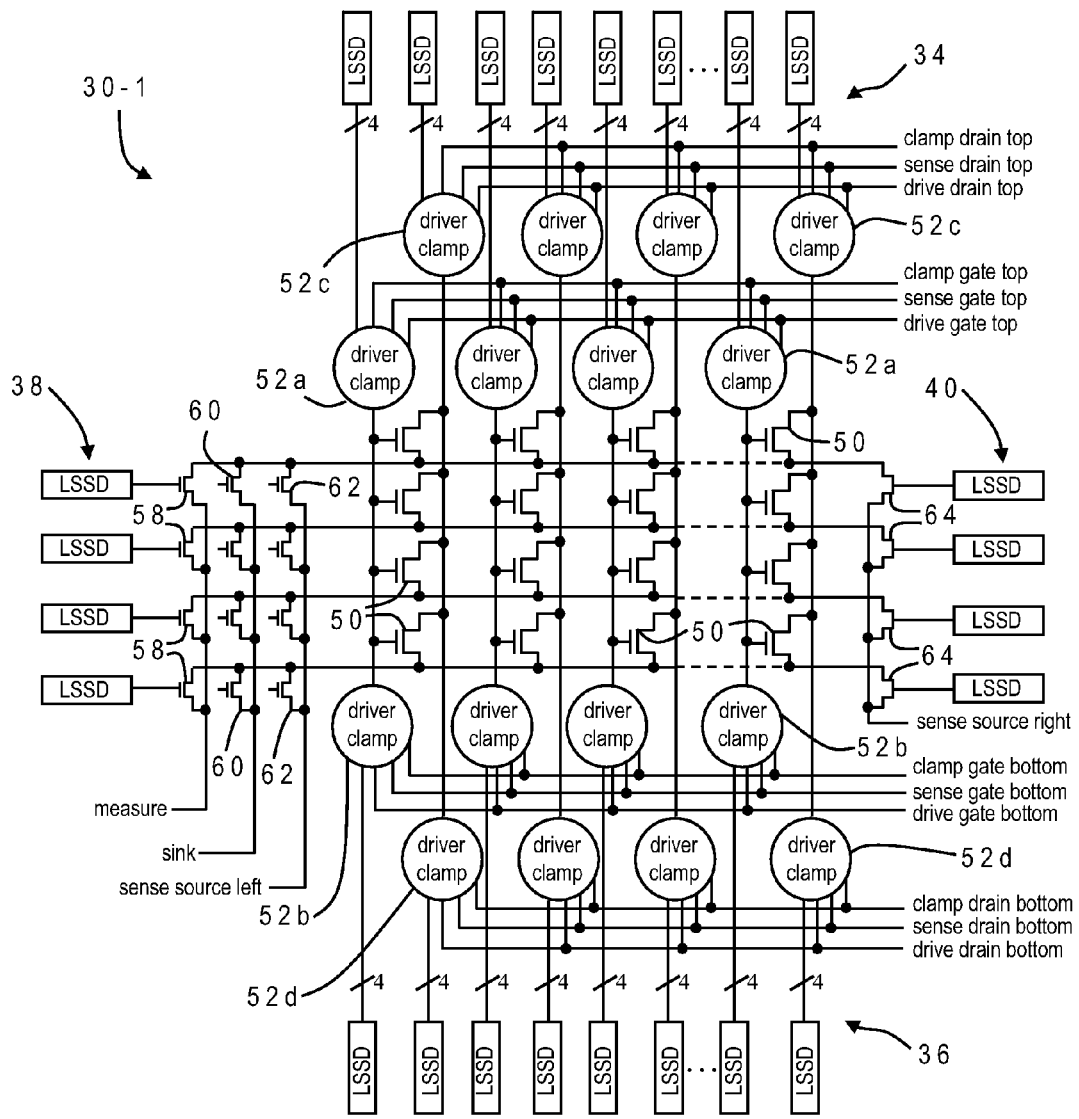
FIG. 3 is a schematic diagram for one implementation of the test structure of FIG. 2.

With further reference to FIG. 3, there is depicted in more detail one implementation for the test system of FIG. 2. Test circuit 30-1 includes a plurality of transistors (DUTs) arranged in rows and columns. Each column is driven at its top and its bottom by four driver/clamps (two for the gate line and two for the drain line). In other words, a given column has a top gate driver/clamp 52a, a bottom gate driver/clamp 52b, a top drain driver/clamp 52c, and a bottom drain driver/clamp 52d. Each driver/clamp has three voltage lines: top gate driver/clamp 52a has a top gate clamp input, a top gate drive input, and a top gate sense output; bottom gate driver/clamp 52b has a bottom gate clamp input, a bottom gate drive input, and a bottom gate sense output; top drain driver/clamp 52c has a top drain clamp input, a top drain drive input, and a top drain sense output; bottom drain driver/clamp 52d has a bottom drain clamp input, a bottom drain drive input, and a bottom drain sense output.

The size of the array may vary; although only four rows are shown, an exemplary array has 1,000 columns and 96 rows, for a total of 96,000 devices. Based on current device technology the size of this array is about 1250 µm×110 µm. Driving the gate line and the drain line of each column from both the top and bottom ends reduces or minimizes parasitic effects, and the small height of the structure ensures that the worst case parasitic drop in a column line does not exceed about 1 mV.

Figure 4:
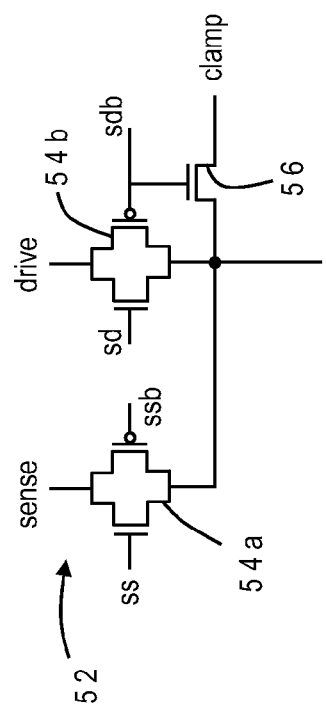
FIG. 4 is a schematic diagram depicting in detail the driver/clamp used in the test circuit of FIG. 3.

Each driver/clamp is also selectively controlled by a respective LSSD latch. In the illustrative embodiment a driver/clamp has four inputs from its corresponding LSSD latch, in addition to the three voltage lines. The driver/clamps may be implemented as shown in FIG. 4. Each driver/clamp 52 has two transistor pairs 54a, 54b comprised of an n-type field effect transistor (nfet) coupled drain-to-drain and source-to-source with to a p-type field effect transistor (pfet). An input of nfet/pfet pair 54a is connected to the sense voltage (gate or drain), and an input of nfet/pfet pair 54b is connected to the drive voltage (gate or drain). The gates of the nfet/pfet pairs are controlled by the four outputs of the corresponding LSSD latch: ss (select sense) controls the gate of the nfet transistor in pair 54a, ssb (inverted select sense) controls the gate of the pfet transistor in pair 54a, sd (select drive) controls the gate of the nfet transistor in pair 54b, and sdb (inverted select drive) controls the gate of the pfet transistor in pair 54b. The outputs of the nfet/pfet pairs 54a, 54b are connected to a column driver line (gate or drain). The column driver line is also connected to the clamp voltage via another nfet transistor 56 whose gate is controlled by the inverted select drive signal from the LSSD latch.

When a given transistor 50 is to be tested, the column for that transistor is selected by setting the corresponding LSSD latch to output a high (active or 1) signal for sd and a low (inactive or 0) signal for sdb. These settings turn on nfet/pfet pair 54b to drive the column driver lines with the drive voltages. For non-selected columns (columns of non-selected devices), the column lines (gate or drain) are turned off when sd is low and sdb is high; this setting for sdb also ties the column driver line to the clamp voltage. The gate clamp voltage can be chosen to drive the gate lines of the non-selected columns with a negative voltage to minimize their leakage currents. For this nfet DUT implementation the term "negative voltage" refers to a voltage lower than the source potential of the nfet, i.e., below zero or electrical ground, but in a pfet DUT implementation the term refers to a voltage higher than the source potential of the pfet, i.e., above the power supply $V_{dd}$.

The sense signal from nfet/pfet pair 54a provides a high impedance output which can be used to measure the voltage being applied at the top or bottom end of the column. The sense output can be used to calibrate the drive or clamp signals, or can be used to dynamically monitor those signals and compensate for voltage strength variations by using the sense signal as an input to a feedback loop that adjusts the power supply for the drive or clamp voltages. Providing a different pair of gate control signals from the LSSD latch (ss, ssb) allows the designer to optionally implement the sense output for either selected or non-selected columns. In another embodiment, the gate and drain voltages are driven from only one end of the columns (e.g., top) while the sense signal is taken at the opposite end (e.g., bottom).

Returning to FIG. 3, once a column is selected left side LSSD bank 38 acts as a current steering circuit to selectively direct the current from the row of the selected DUT to a measuring pin while the currents of the remaining (non-selected) rows are directed to a sink pin. For a given row, one transistor 58 at left side LSSD bank 38 is used to connect the row output line to the measurement pin, and another transistor 60 at left side LSSD bank 38 is used to connect the row output to the sink pin. The left side LSSD latch corresponding to the row for the selected DUT will accordingly turn on its transistor 58 while the left side LSSD latches corresponding to non-selected rows will turn on their transistors 60. The current steering devices 58, 60 are preferably made of thick oxide that reduces the relative gate leakage current by orders of magnitude.

These steering devices lie in series between the source terminal of the DUT and electrical ground, causing the row voltages to rise slightly above ground. The parasitic resistance of the wire also adds an additional resistance between the source node of the DUT and the steering device. To account for these resistive voltage (IR) drops, sense capability is added to measure the row voltages at both ends of the array. To this end, each left side LSSD latch in bank 38 also controls a third transistor 62 which provides a high impedance sense source left voltage output ($V_L$) for a selected row, and each right side LSSD latch in bank 40 controls another transistor 64 which provides a high impedance sense source right voltage output ($V_R$).

Figure 5:
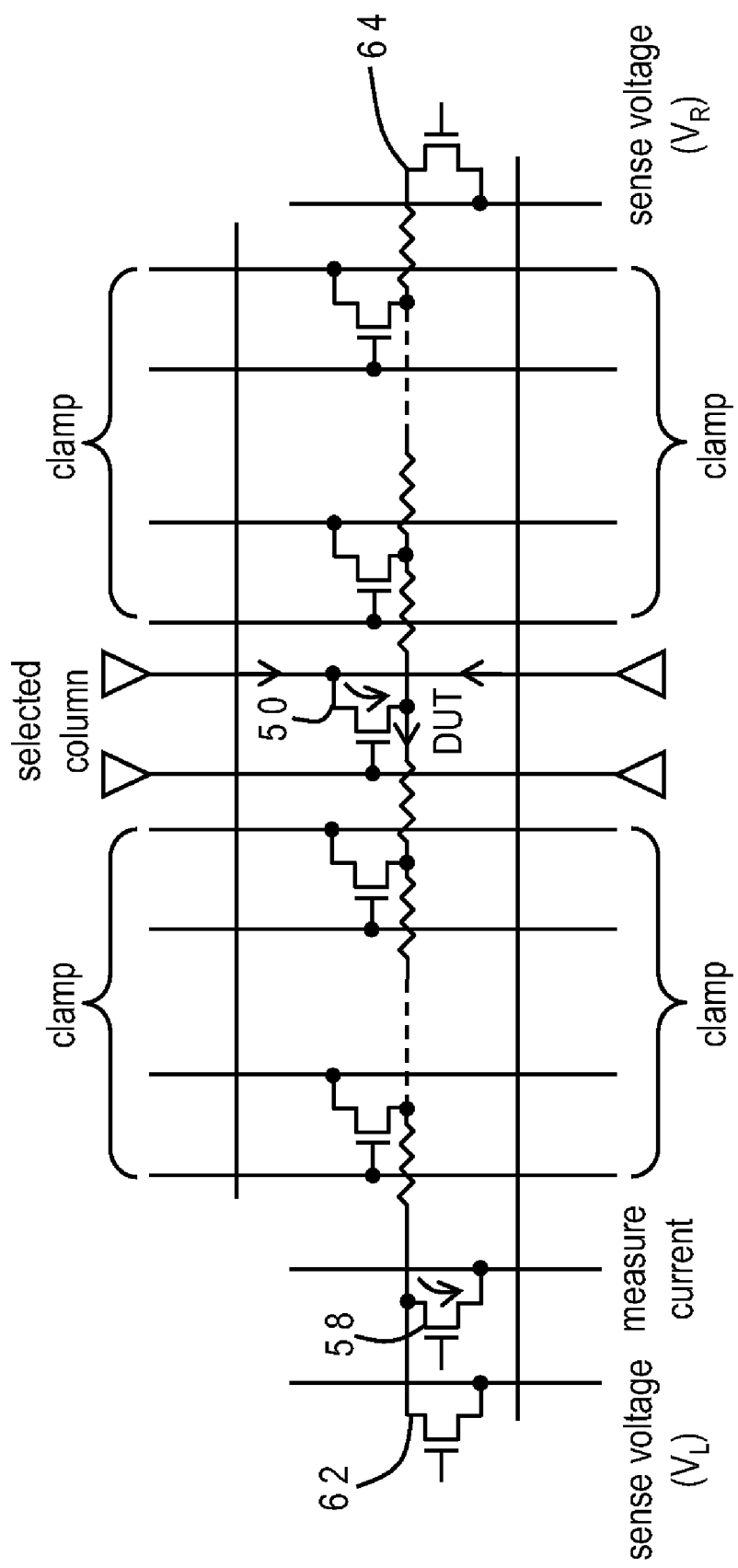
FIG. 5 is a schematic diagram illustrating how the test circuit of FIG. 3 provides for row sensing to remove the effects of resistive loading in the measurement.

As further shown in FIG. 5, the setup steers all current in the left direction, hence the sense voltage at the right side may be used as a measure of the exact voltage appearing at the source node of the selected DUT. This current steering allows the measurement of extremely low currents (for example, gate leakage) of a DUT embedded in an array of devices. The difference between the sense voltages at the two ends of a row can also be used as an indicator of the IR drop due to parasitic resistances. Thus any voltage measurement for the device under test may be calibrated by deriving the difference between the sensed voltages at the left and right ends of the selected row and providing this difference to the measurement unit.

Figure 6:
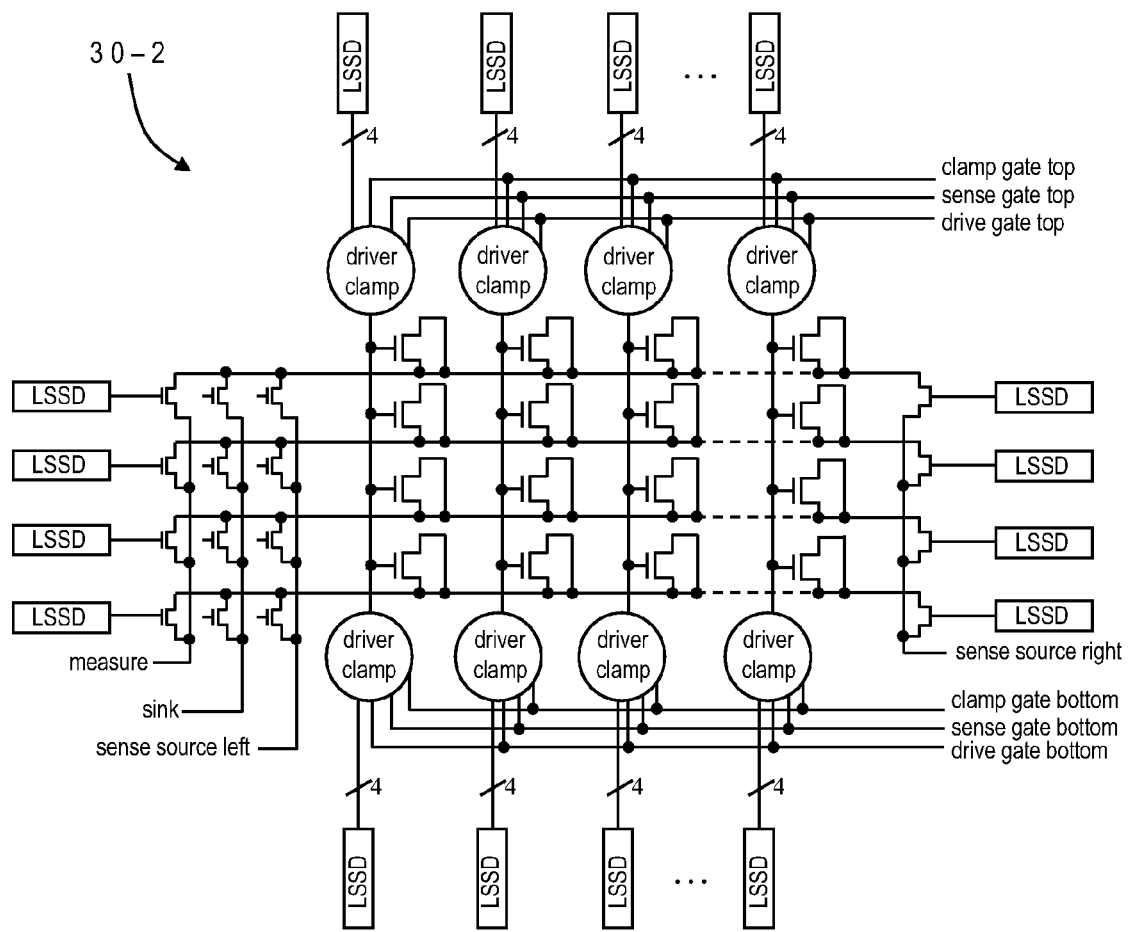
FIG. 6 is a schematic diagram for another implementation of the test structure of FIG. 2.

As embodied in the test circuit of FIG. 3, the present invention is particularly useful in measuring the I-V characteristics of individual devices; however, the invention has wider application to other measurements. FIG. 6 shows another test circuit 30-2 which may be used to assess gate oxide reliability. Test circuit 30-2 is essentially identical to test circuit 30-1 except that the drains of each transistor under test have been shorted to their respective sources, and consequently there are no column drivers or driver/clamps for the drains. Test circuit 30-2 still drives the gate lines from top and bottom, and selectively steers the row currents to a measurement pin or a sink pin. Sense voltages from the right and left side are again used for calibration. This setup allows for testing of the resistance between the gate and the shorted drain/source.

The present invention accordingly provides a row/column addressable array that enables resource sharing of many devices, along with a built-in sensing mechanism to calibrate or null out sources of error, and current steering to avoid negative effects of current leakage along spurious paths. The invention is capable of accommodating large number of DUTs, e.g., millions of DUTs implemented with only 20 pins, while still providing high spatial resolution of current measurements. The measured results can be used to analyze the impact of local device mismatch on stable operation of, e.g., SRAM cells. The impact of channel doping on random dopant fluctuation may be studied by including devices with different $V_T$ implants in the array.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A test circuit comprising:
   an array of electronic devices under test arranged in rows and columns;
   a plurality of column driver lines, at least one for each column of said electronic devices under test;
   a plurality of row output lines, at least one for each row of said electronic devices under test;
   a plurality of driver/clamps which selectively drive at least one of said column driver lines with a drive voltage while connecting remaining column driver lines to a clamp voltage;
   a steering circuit which selectively directs a current output for one of said row output lines to a measurement pin at a first side of the array which is opposite a second side of the array while directing current output from remaining row output lines to a sink pin;
   a first plurality of taps at the first side of the array which sense first voltages of said row output lines; and
   a second plurality of taps at the second side of the array which sense second voltages of said row output lines.

2. The test circuit of claim 1 wherein the clamp voltage is a negative voltage.

3. The test circuit of claim 1 wherein said steering circuit uses steering devices which lie in series between source terminals of the electronic devices and electrical ground.

4. The test circuit of claim 1 wherein:
   said electronic devices are transistors each having a gate, drain and source; and
   said plurality of column driver lines includes a plurality of gate column driver lines and a plurality of drain column driver lines.

5. The test circuit of claim 4 wherein the drain and source for each transistor are shorted together.

6. The test circuit of claim 1 wherein said driver/clamps drive the column driver lines from both a top of the column driver lines and a bottom of the column driver lines.

7. The test circuit of claim 6 wherein said driver/clamps further have sense voltage outputs at both the top of the column driver lines and the bottom of the column driver lines.

8. A system for testing an array of electronic devices, comprising:
   a plurality of column driver lines, each column driver line being connected to input nodes for a column of the electronic devices;
   a plurality of row output lines, each row output line being connected to output nodes for a row of the electronic devices;
   a plurality of driver/clamps which selectively drive at least one of said column driver lines with a drive voltage while connecting remaining column driver lines to a clamp voltage;
   a first plurality of individually addressable latches whose outputs control said driver/clamps;
   a measurement unit;
   a plurality of steering devices which selectively direct a current output for one of said row output lines to said measurement unit at a first side of the array which is opposite a second side of the array while directing current output from remaining row output lines to a sink;
   a first plurality of taps at the first side of the array which sense first voltages of said row output lines;
   a second plurality of individually addressable latches whose outputs control said steering devices and said first plurality of taps;
   a second plurality of taps at the second side of the array which sense second voltages of said row output lines;
   a third plurality of individually addressable latches whose outputs control said second plurality of taps; and
   an external interface which allows a user to set values in said addressable latches.

9. The system of claim 8 wherein the clamp voltage is a negative voltage.

10. The system of claim 8 wherein said steering devices lie in series between source terminals of the electronic devices and electrical ground.

11. The system of claim 8 wherein:
    the electronic devices are transistors each having a gate, drain and source; and
    said plurality of column driver lines includes a plurality of gate column driver lines and a plurality of drain column driver lines.

12. The system of claim 11 wherein the drain and source for each transistor are shorted together.

13. The system of claim 8 wherein said driver/clamps drive the column driver lines from both a top of the column driver lines and a bottom of the column driver lines.

14. The system of claim 13 wherein said driver/clamps further have sense voltage outputs at both the top of the column driver lines and the bottom of the column driver lines.

* * * * *